(12) United States Patent  
Kawakita et al.

(10) Patent No.: US 11,322,423 B2  
(45) Date of Patent: May 3, 2022

(54) ELECTRONIC CONTROL DEVICE

(71) Applicant: Hitachi Automotive Systems, Ltd., Hitachinaka (JP)

(72) Inventors: Shinya Kawakita, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 16/975,613

(22) PCT Filed: Nov. 19, 2018

(86) PCT No.: PCT/JP2018/042705  
§ 371 (c)(1),  
(2) Date: Aug. 25, 2020

(87) PCT Pub. No.: WO2019/187321  
PCT Pub. Date: Oct. 3, 2019

(65) Prior Publication Data  
US 2020/0411406 A1 Dec. 31, 2020

(30) Foreign Application Priority Data  
Mar. 26, 2018 (JP) .............................. JP2018-058156

(51) Int. Cl.  
*H01L 23/34* (2006.01)  
*H01L 23/373* (2006.01)  
(Continued)

(52) U.S. Cl.  
CPC ........ *H01L 23/373* (2013.01); *H01L 23/3107* (2013.01); *H01L 24/73* (2013.01);  
(Continued)

(58) Field of Classification Search  
CPC ... H01L 23/373; H01L 23/3107; H01L 23/34; H01L 23/36; H05K 7/20472  
(Continued)

(56) References Cited

U.S. PATENT DOCUMENTS 4,978,638 A * 12/1990 Buller ................ H01L 23/4093  
                                                                 156/91  
5,201,866 A * 4/1993 Mok ....................... F28F 3/02  
                                                                 165/185  
(Continued)

FOREIGN PATENT DOCUMENTS

JP     2002-134970 A    5/2002  
JP     2012-31242 A    2/2012  
(Continued)

OTHER PUBLICATIONS

International Search Report (PCT/ISA/210) issued in PCT Application No. PCT/JP2018/042705 dated Jan. 22, 2019 with English translation (two (2) pages).

(Continued)

*Primary Examiner* — Nitin Parekh  
(74) *Attorney, Agent, or Firm* — Crowell & Moring LLP

(57) ABSTRACT

An electronic control device includes: a board; a heat generating component mounted on the board; a heat conductive sheet thermally coupled to one surface of the heat generating component located on a side opposite to the board side; and a cooling mechanism thermally coupled to the heat conductive sheet. The heat conductive sheet includes a folded structure having a plurality of folded-back portions and a plurality of connection portions provided between the folded-back portions, and the plurality of folded-back portions of the heat conductive sheet is thermally coupled to each of the heat generating component and the cooling mechanism.

7 Claims, 10 Drawing Sheets

(51) Int. Cl.
*H01L 23/31* (2006.01)
*H01L 23/00* (2006.01)
*H05K 7/20* (2006.01)

(52) U.S. Cl.
CPC ............... *H05K 7/20472* (2013.01); *H01L 2224/73253* (2013.01); *H01L 2924/15311* (2013.01); *H01L 2924/181* (2013.01)

(58) Field of Classification Search
USPC .................................... 257/712–713, 706
See application file for complete search history.

(56) References Cited

U.S. PATENT DOCUMENTS

| | | | | |
|---|---|---|---|---|
| 5,708,297 | A * | 1/1998 | Clayton | H01L 23/13 |
| | | | | 257/712 |
| 9,978,231 | B2 * | 5/2018 | Isaacs | G08B 13/128 |
| 2002/0118511 | A1 * | 8/2002 | Dujari | F28D 15/0233 |
| | | | | 361/703 |
| 2004/0238857 | A1 * | 12/2004 | Beroz | H01L 23/36 |
| | | | | 257/232 |
| 2006/0145356 | A1 * | 7/2006 | Liu | H01L 23/36 |
| | | | | 257/777 |
| 2007/0096160 | A1 * | 5/2007 | Beroz | H01L 23/36 |
| | | | | 257/232 |

FOREIGN PATENT DOCUMENTS

| | | |
|---|---|---|
| JP | 2015-201534 A | 11/2015 |
| JP | 2018-22923 A | 2/2018 |

OTHER PUBLICATIONS

Japanese-language Written Opinion (PCT/ISA/237) issued in PCT Application No. PCT/JP2018/042705 dated Jan. 22, 2019 (six (6) pages).

\* cited by examiner

ELECTRONIC CONTROL DEVICE

TECHNICAL FIELD

The present invention relates to an electronic control device.

BACKGROUND ART

A vehicle such as an automobile is equipped with, for example, an electronic control device for engine control, motor control, automatic transmission control, and the like. The electronic control device includes a heat generating component such as a semiconductor element that generates high temperature. Such a heat generating component is normally interposed between a circuit board and a heat radiation case.

It is known that, in a structure in which an outer case that houses an entire electronic control device is a metal heat radiation case, a step portion is provided in the outer case and a heat generating component is mounted between the step portion as a low-height portion and a circuit board. In this structure, a silicone-based heat conductive member is interposed between the step portion and the heat generating component (for example, see PTL 1).

CITATION LIST

Patent Literature

PTL 1: JP 2002-134970 A

SUMMARY OF INVENTION

Technical Problem

In an electronic control device, a load acts on a heat generating component due to thermal deformation or vibration of a circuit board or the like. In the invention described in PTL 1 above, when an elastic modulus of the heat conductive member is high, the load acting on the heat generating component may not be able to be reduced.

Solution to Problem

According to one aspect of the present invention, an electronic control device includes: a board; a heat generating component mounted on the board; a heat conductive sheet thermally coupled to one surface of the heat generating component located on a side opposite to the board side; and a cooling mechanism thermally coupled to the heat conductive sheet, in which the heat conductive sheet includes a folded structure having a plurality of folded-back portions and a plurality of connection portions provided between the folded-back portions, and the plurality of folded-back portions of the heat conductive sheet is thermally coupled to each of the heat generating component and the cooling mechanism.

Advantageous Effects of Invention

According to the present invention, even if thermal deformation or vibration is loaded, a load acting on a heat generating component is relieved by deformation of a heat conductive sheet, and reliability of the heat generating component can be improved.

BRIEF DESCRIPTION OF DRAWINGS

FIG. 6A is a side view before bending a heat conductive sheet material for forming a heat conductive sheet, FIG. 6B is a plan view of the heat conductive sheet material in FIG. 6A as viewed from below, and FIG. 6C is a schematic view showing an orientated state of the heat conductive sheet.

DESCRIPTION OF EMBODIMENTS

First Embodiment

Hereinafter, a first embodiment of the present invention will be described with reference to FIGS. 1 to 7.

Figure 1:
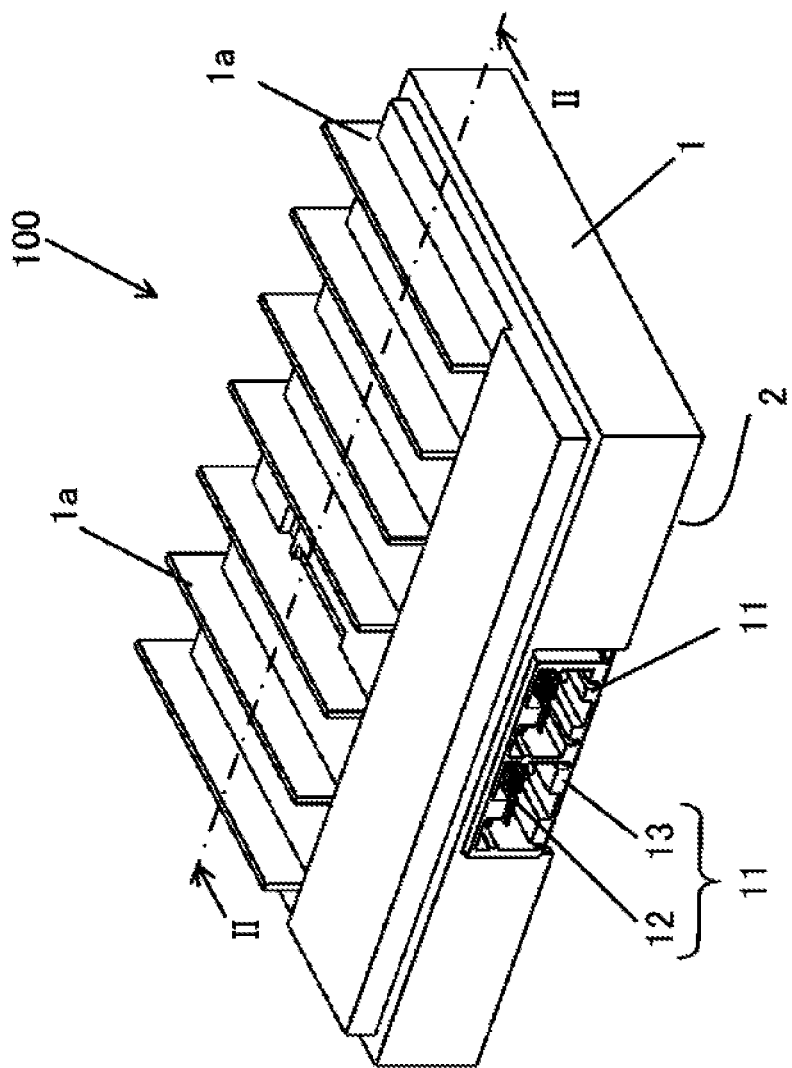
FIG. 1 is an external perspective view of an electronic control device according to a first embodiment of the present invention.
Figure 2:
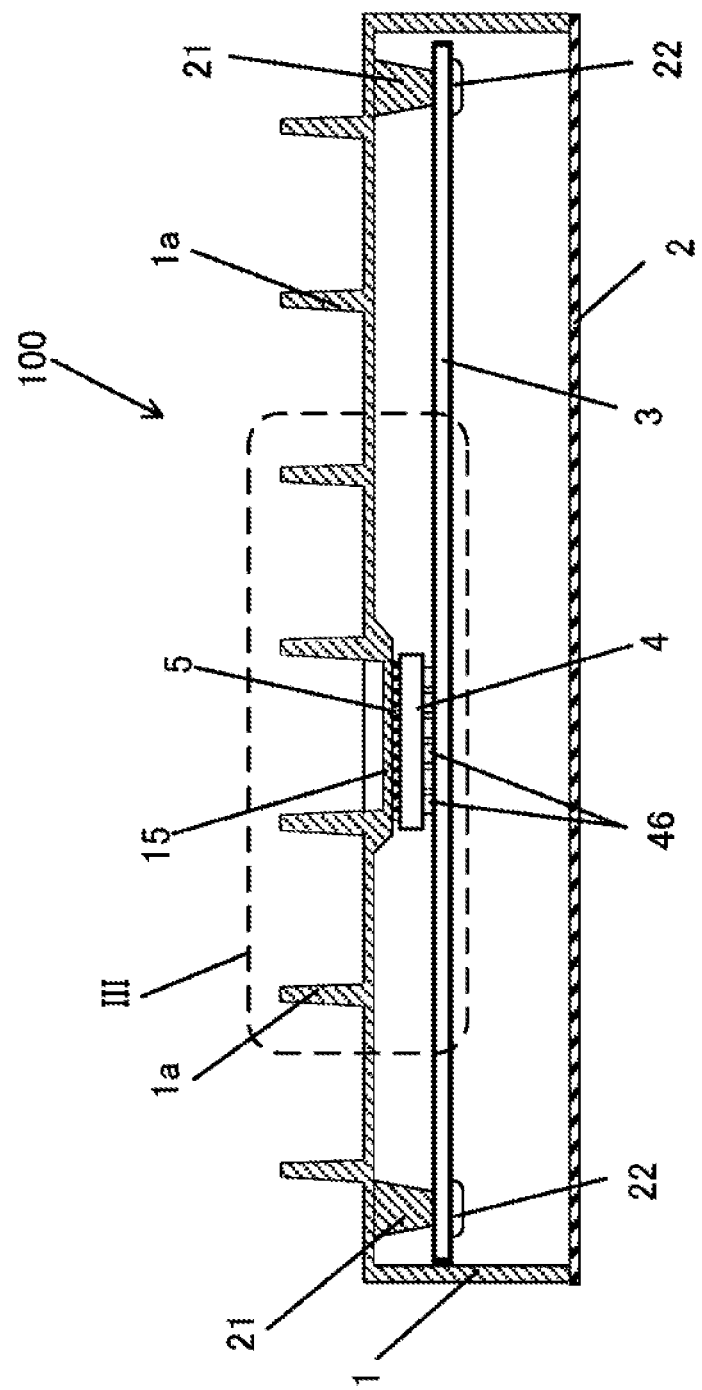
FIG. 2 is a sectional view of the electronic control device shown in FIG. 1 taken along line II-II.

FIG. 1 is an external perspective view of an electronic control device of the present invention, and FIG. 2 is a sectional view of the electronic control device shown in FIG. 1 taken along line II-II.

An electronic control device 100 has a housing including a case body 1 and a cover 2. The case body 1 and the cover 2 are fixed by fastening members such as screws (not shown). On a front surface of the housing, one or a plurality of (exemplified as two in FIG. 1) connectors 11 is arranged. Inside the housing, a circuit board 3, a heat generating component 4 including a semiconductor element such as a microcomputer, and a heat conductive member 5 are housed.

The case body 1 is formed of a metal material having excellent thermal conductivity such as aluminum (for example, ADC12). As shown in FIG. 2, the case body 1 has a side wall around the periphery, and is formed in a box shape whose lower side (cover 2 side) is open. At four corners in the case body 1, bosses 21 protruding toward the circuit board 3 are provided. The circuit board 3 is fixed to end surfaces of the bosses 21 by screws 22. On an upper surface of the case body 1, a plurality of heat radiation fins 1a protruding upward is provided. As shown in FIG. 1, a front side of the upper surface of the case body 1 is a flat portion, and each heat radiation fin 1a is formed in a plate shape extending from a rear end of the flat portion to a rear side of the case body 1. The heat radiation fin 1a and the boss 21 are formed integrally with the case body 1 by casting such as die casting. However, the heat radiation fin 1a or the boss 21 may be manufactured as a separate member from the case body 1 and attached to the case body.

The connector 11 is formed by press fitting or insert molding a connector pin 12 in a connector body 13 made of a thermosetting resin containing glass fiber. A hole or cut-away part for inserting the connector 11 is formed in the side wall on the front side of the case body 1, and the connector pin 12 of the connector 11 is connected to a wiring pattern (not shown) formed on the circuit board 3 through the hole or cut-away part. The connector pin 12 and the wiring pattern are connected by, for example, soldering. Power and a control signal are transmitted and received between the outside and the electronic control device 100 via the connector 11.

The cover 2 is made of a metal material having excellent thermal conductivity such as aluminum, similarly to the case body 1. The cover 2 can be made of a sheet metal such as iron or a non-metallic material such as a resin material to reduce a cost.

The heat generating component 4 is mounted on the circuit board 3, and a step portion 15 protruding toward the circuit board 3 is formed on an upper part of the case body 1. The step portion 15 is formed as a part of the case body 1 by casting. The heat generating component 4 is mounted on the circuit board 3 by bonding materials 46.

Although not shown, passive elements such as a capacitor are also mounted on the circuit board 3, and a wiring pattern for connecting these electronic components and the connector is also formed. The circuit board 3 is formed of, for example, an organic material such as an epoxy resin and an inorganic material such as a glass cloth. Preferably, the circuit board 3 is formed of an FR4 material. The circuit board 3 can be a single-layer board or a multilayer board.

The heat conductive member 5 is interposed between the heat generating component 4 and the step portion 15 of the case body 1. Heat generated by the heat generating component 4 is mainly conducted to the case body 1 via the heat conductive member 5, and is radiated from the case body 1 to the outside. The heat radiation fins 1a improve a heat radiation effect.

Figure 3:
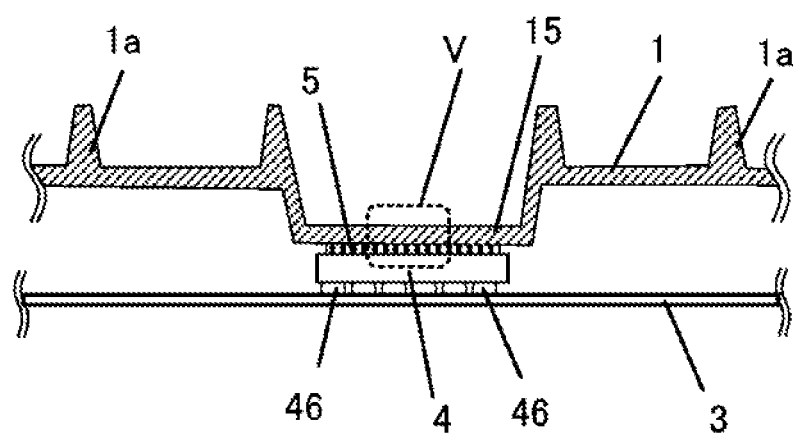
FIG. 3 is an enlarged view of a region III of the electronic control device shown in FIG. 2.

FIG. 3 is an enlarged view of a region III of the electronic control device shown in FIG. 2, and shows an example of a heat radiation structure of the present invention.

The case body 1 having the plurality of heat radiation fins 1a and formed of a metal material having excellent thermal conductivity forms a cooling mechanism. As described above, the heat conductive member 5 is interposed between the heat generating component 4 and the step portion 15 of the case body 1. Details of the heat conductive member 5 will be described later.

Figure 4:
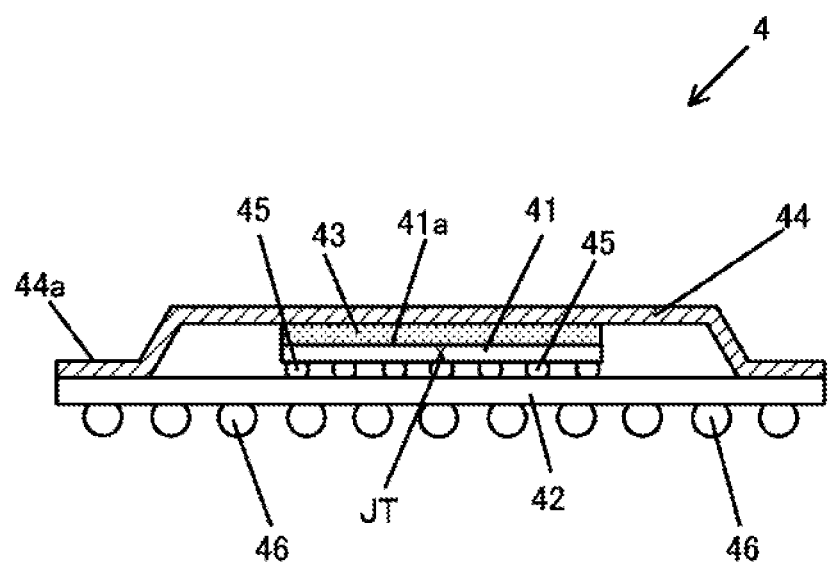
FIG. 4 is a sectional view showing an example of a heat generating component shown in FIG. 2.

FIG. 4 is a sectional view illustrating an example of the heat generating component 4.

The heat generating component 4 is a ball grid array (BGA) type semiconductor device.

The heat generating component 4 has a bare semiconductor chip 41 in which an integrated circuit is formed. The semiconductor chip 41 is flip-chip mounted on an interposer 42 by bonding materials 45 such as solder. On the semiconductor chip 41, a heat radiation material 43 is formed. A metal lid is formed to cover the heat radiation material 43. A peripheral edge of the lid 44 is a low-height portion 44a bent toward the interposer 42. A plurality of bonding materials 46 is formed on a surface of the interposer 42 opposite to a surface on the semiconductor chip 41 side. The integrated circuit formed inside the semiconductor chip 41 is connected to the bonding materials 46 through the bonding materials 45 and a wiring pattern and a via (or through hole) (both not shown) provided on the interposer 42. The bonding materials are, for example, solder balls and electrically and mechanically bond the semiconductor chip 41 and the circuit board 3, as described above.

Figure 5:
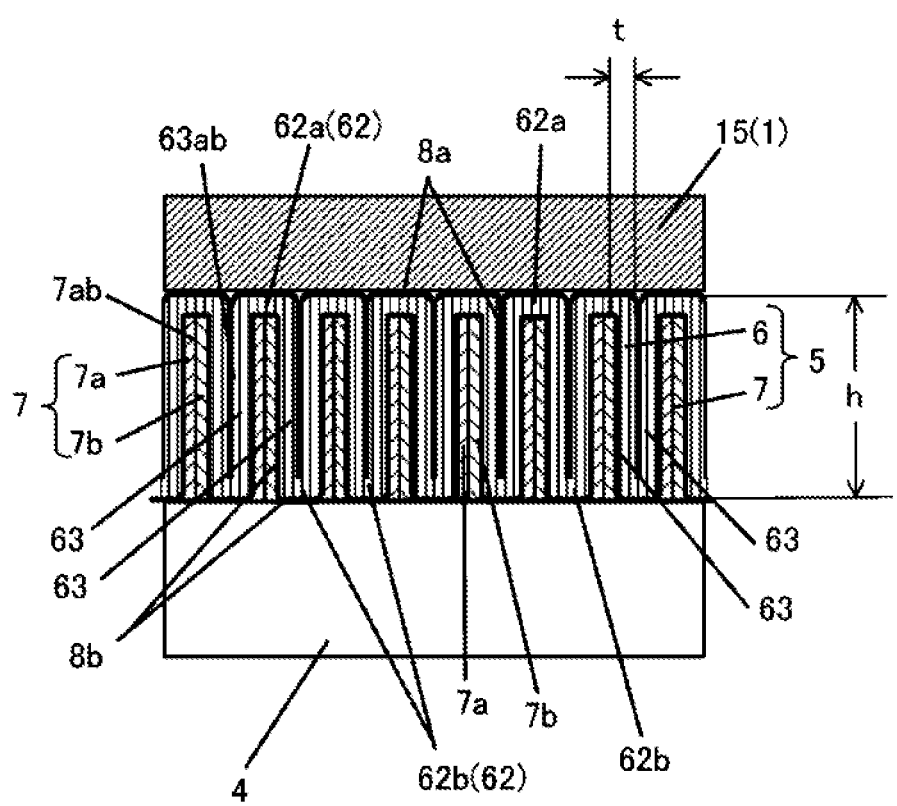
FIG. 5 is an enlarged view of a region V shown in FIG. 3.

FIG. 5 is an enlarged view of a region V illustrated in FIG. 3.

The heat conductive member 5 has a heat conductive sheet and a sliding layer 7 formed of a metal foil such as aluminum. As the heat conductive sheet 6, for example, a graphite sheet laminate in which single-layer graphite sheets are laminated can be used. The graphite sheet laminate will be described later.

The heat conductive sheet 6 has a folded-back portion 62 formed vertically and a connection portion 63 provided between upper and lower folded-back portions 62, and has a zigzag folded structure between the heat generating component 4 and the step portion 15 of the case body 1. The folded-back portion 62 has one (upper side) folded-back portion 62a that connects a pair of connection portions 63 facing each other via sliding layers 7a and 7b and another (lower side) folded-back portion 62b that connects a pair of adjacently arranged connection portions 63. In other words, the heat conductive sheet 6 has the one folded-back portion 62a formed on the step portion 15 side of the case body 1 and the other folded-back portion 62b formed on the heat generating component 4 side.

Adhesive layers 8a and 8b are provided on one surface and another surface of the heat conductive sheet 6, respectively. The pair of connection portions 63 facing each other with the one folded-back portion 62a interposed therebetween has facing surfaces 63ab adhered by the adhesive layer 8a. Further, the one folded-back portion 62a of the heat conductive sheet 6 is adhered to the step portion 15 of the case body 1 by the adhesive layer 8a formed on an upper surface of the one folded-back portion 62a. In other words, the heat conductive sheet 6 is thermally coupled to the case body 1 via the adhesive layer 8a.

The pair of sliding layers 7a and 7b is arranged between the pair of connection portions 63 facing each other with the other folded-back portion 62b interposed therebetween. The pair of sliding layers 7a and 7b is adhered to the adhesive layer 8b provided on the other surface of the heat conductive sheet 6. The other folded-back portion 62b of the heat conductive sheet 6 is adhered to the heat generating component 4 by the adhesive layer 8b formed on an upper surface of the other folded-back portion 62b. In other words, the heat conductive sheet 6 is thermally coupled to the heat generating component 4 via the adhesive layer 8b.

Therefore, the heat generated by the heat generating component 4 is conducted to the step portion 15 of the case body 1 via the other folded-back portion 62b, the connection portion 63, and the one folded-back portion 62a of the heat conductive sheet 6, and is radiated from the case body 1 that constitutes the cooling mechanism.

Facing surfaces 1ab of the pair of sliding layers 7a and 7b facing each other are non-adhesive surfaces, and an air layer (not shown) is interposed between the facing surfaces 7ab. Thereby, the pair of sliding layers 7a and 7b becomes deformable sliding surfaces relatively movable in an extending direction of the facing surfaces, that is, in a direction intersecting the case body 1 and the heat generating component 4.

In the electronic control device 100, due to a difference in thermal expansion coefficient between materials and the like forming the case body 1, the heat generating component 4, and the circuit board 3, deformation including warpage occurs on the circuit board 3 by a change in environmental temperature. In addition, vibration is transmitted to the electronic control device 100 mounted on a vehicle or the like. For this reason, a load is applied to the heat generating component 4 due to the thermal deformation or vibration, and the heat generating component 4 and the bonding materials 46 may be damaged or characteristics thereof may be degraded. As described above, the heat conductive member 5 of the electronic control device 100 of the present embodiment slides and deforms on the facing surfaces 7ab of the pair of sliding layers 7a and 7b in the extending direction of the facing surfaces. In other words, the heat conductive sheet 6 flexibly deforms following the thermal deformation or vibration of the circuit board 3. Therefore, the load on the heat generating component 4 is reduced. As a result, damage to the heat generating component 4 and deterioration of characteristics thereof are prevented, and reliability can be improved.

Figure 6A:
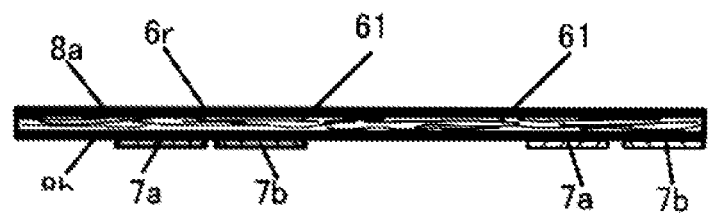
FIGS. 6A to 6C show a method of manufacturing a heat conductive member shown in FIG. 5.
Figure 6B:
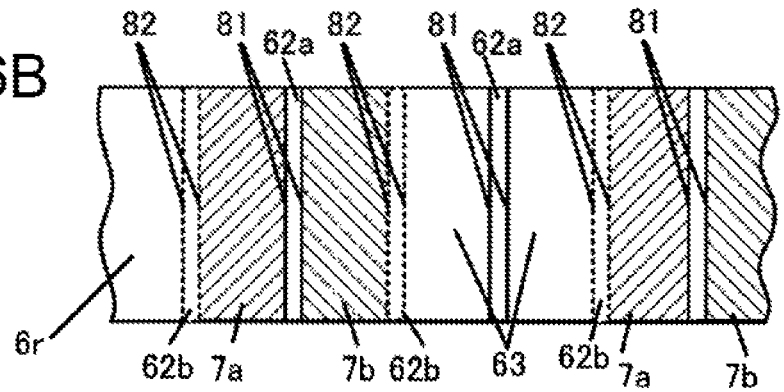
Figure 6C:
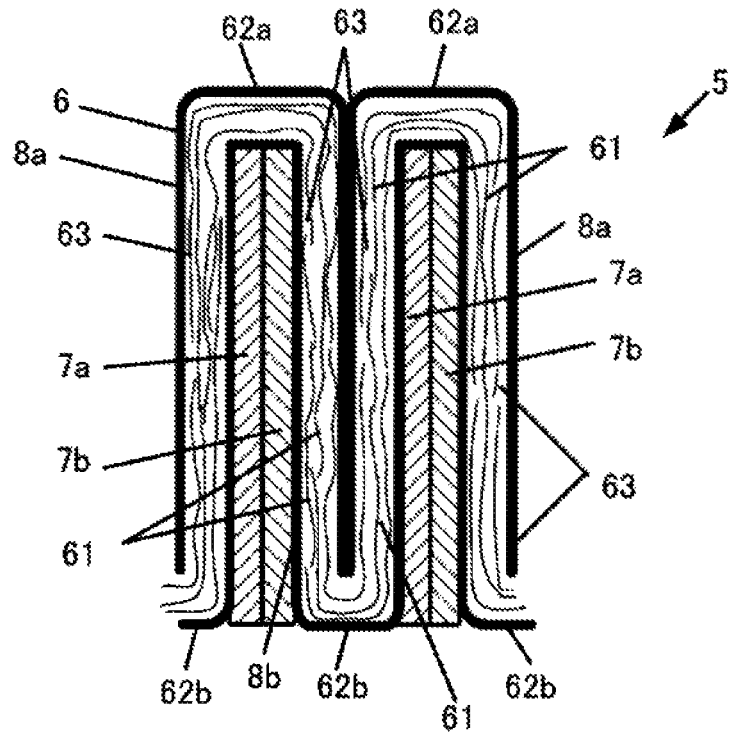

FIG. 6 shows a method of manufacturing the heat conductive member shown in FIG. 5. FIG. 6(a) is a side view of a heat conductive sheet material before bending the heat conductive sheet, FIG. 6(b) is a plan view of the heat conductive sheet material in FIG. 6(a) as viewed from below, and FIG. 6(c) is a schematic view showing a crystal oriented state of the heat conductive sheet.

To manufacture the heat conductive member 5, first, a long heat conductive sheet material 6r having a predetermined width is prepared. The heat conductive sheet material 6r is configured as a single-layer graphite sheet 61 or a graphite sheet laminate in which the single-layer graphite sheets 61 are laminated. Adhesive layers 8a and 8b are provided on one surface and another surface of the heat conductive sheet material 6r, respectively. A release sheet (not shown) is adhered to a surface of each of the adhesive layers 8a and 8b opposite to the heat conductive sheet material 6r side. As shown in FIG. 6(a), a plurality of pairs of sliding layers 7a and 7b formed of a metal foil such as aluminum is adhered to the adhesive layer 8b adhered to the other surface of the heat conductive sheet material 6r. Before adhering the sliding layers 7a and 7b, the release sheet adhered to a portion of the adhesive layer 8b where the sliding layers 7a and 7b are adhered is removed. The sliding layer 7a and the sliding layer 7b are separated from each other so that one folded-back portion 62a is formed in a longitudinal direction of the heat conductive sheet material 6r. Also, the pair of sliding layers 7a and 7b is disposed far apart from each other so that a pair of connection portions 63 is formed with another folded-back portion 62b interposed therebetween. Note that the sliding layers 7a and 7b can also be formed by vapor deposition, sputtering, or plating. In this case, it is desirable not to provide the adhesive layer 8b on a portion of the heat conductive sheet material 6r where the sliding layers 7a and 7b are adhered. Alternatively, the adhesive layer adhesive layer 8b may not be provided except for portions in contact with the heat generating component 4 and the case body 1.

Then, as shown in FIG. 6(b), the heat conductive sheet material 6r is bent at bent portions 81 and 82. In FIG. 6(b), the bent portion 81 indicates a mountain fold, and the bent portion 82 indicates a valley fold. A region between a pair of bent portions 81 is a region to be the one folded-back portion 62a, and a region between a pair of bent portions 82 is a region to be the other folded-back portion 62b. While the heat conductive sheet material 6r is bent at the bent portions 81 and 82, the release sheet adhered to the adhesive layer 8a is removed, and the pair of connection portions 63 between the one adjacent folded-back portions 62a is adhered with the adhesive layer 8a. Accordingly, the heat conductive member 5 provided with the heat conductive sheet 6 having a folded structure illustrated in FIG. 6(c) and the sliding layers 7a and 7b interposed between the pair of connection portions 63 sandwiching the one folded-back portion 62a is manufactured.

Note that, as described later, the release sheet adhered to the adhesive layer 8b is released before the heat conductive member 5 is adhered to the heat generating component 4.

In the above, the folded-back portions 62a and 62b are exemplified as structures formed between the pair of bent portions 81 and 82, respectively. However, since the sliding layers 7a and 7b are extremely thin layers, each of the folded-back portions 62a and 62b may be composed of the one bent portion 81 and 82, respectively. In other words, the one folded-back portion 62a may be formed by the one bent portion 81, and the other folded-back portion 62b may be formed by the one bent portion 82.

Graphite constituting the heat conductive sheet 6 has anisotropic thermal conductivity in which thermal conductivity is different between a crystal in-plane direction and a crystal interlayer direction due to a crystal structure, and has high thermal conductivity to the interlayer direction in the crystal in-plane direction. As shown in FIG. 6(a), in the graphite, the crystal in-plane direction is oriented to a sheet surface direction of the heat conductive sheet material 6r, that is, the crystal interlayer direction is oriented to a thickness direction of the heat conductive sheet material 6r. As shown in FIG. 6(c), the heat conductive sheet 6 obtained by folding back the heat conductive sheet material 6r having such a structure at the folded-back portions 62a and 62b has, in a region of the connection portion 63, the crystal in-plane direction of the graphite oriented to an extending direction of the connection portion 63, that is, a direction substantially perpendicular to the heat generating component 4 and the case body 1. For this reason, thermal conductivity between the one folded-back portion 62a and the other folded-back portion 62b of the connection portion 63 that connects the one folded-back portion 62a and the other folded-back portion 62b can be increased. In other words, the heat conductive member 5 having high thermal conductivity between the heat generating component 4 and the case body 1 can be obtained.

Note that, with reference to FIG. 5, a thickness t of the graphite sheet laminate is, for example, about 15 µm to 100 µm, and a height h of a folded portion is, for example, about 0.2 mm to 3.0 mm. However, these numerical values are merely examples, and can be arbitrarily changed according to a size and a heat generation amount of the heat generating component 4, layout of the case, and the like.

An example of a method for manufacturing the electronic control device 100 will be described.

A heat generating component 4r shown in FIG. 4 is manufactured in advance. Then, the bonding materials 46 are formed on the circuit board 3 by screen printing or the like, and the heat generating component 4r is arranged on the bonding materials 46 and is put into a reflow furnace in this state. The heat generating component 4 is mounted on the circuit board 3 by melting and solidifying the bonding materials 46 during the reflow. If there is another electronic component other than the heat generating component 4, it is mounted on the circuit board 3 by reflowing with the heat generating component 4 or by separately soldering.

Next, the connector 11 is attached to the circuit board 3. A tip of the connector pin 12 of the connector 11 is passed through a pin hole (or a via hole) (not shown) provided on the circuit board 3, and the connector pin 12 is soldered to the pin hole of the circuit board 3 by a partial flow from a back side of the circuit board 3. This soldering can also be performed using a robot. Alternatively, the tip of the connector pin 12 may be press-fitted into the pin hole of the circuit board 3 in a press-fit pin structure. The press-fit pin has a hollow portion at the tip, and when the tip is pressed into the pin hole and the hollow portion is compressed, the tip is held in the pin hole by a restoring action. After the connector pin 12 is electrically and mechanically connected to the circuit board 3 by soldering, the connector 11 is fixed to the case body 1 by adhesion or the like. The fixing between the connector 11 and the case body 1 can be made by fusion. In other words, by irradiating with laser, one or both of the connector body 13 and the case body 1 are melted and solidified, and both are fixed.

On the other hand, the heat conductive member 5 shown in FIG. 6(c) is formed in advance. Then, the case body 1 is turned upside down, and the heat conductive member 5 is adhered to one surface of the step portion 15 of the case body 1 by the adhesive layer 8a. Then, the release sheet adhered to the adhesive layer 8b is released.

Next, the circuit board 3 on which the heat generating component 4 is mounted is attached to the end surfaces of the bosses 21 of the case body 1 using the screws 22. When the circuit board 3 is mounted on the case body 1, the heat generating component 4 is preset so as to be arranged at a position corresponding to the step portion 15 of the case body 1, and the heat generating component 4 is adhered to the adhesive layer 8b of the heat conductive member 5. If necessary, the height h of the folded portion may be longer than a distance between the heat generating component 4 and the step portion 15, and the heat generating component 4 may be adhered to the adhesive layer 8b by pressing against it.

Finally, the electronic control device 100 is obtained by assembling the cover 2 to the case body 1 using a fastening member (not shown).

Example 1

The electronic control device 100 having an appearance shown in FIG. 1 and shown in the sectional view of FIG. 2 was produced using the following members. Note that the circuit board 3 was fixed to the bosses 21 provided at the four corners of the case body 1 with the screws 22.

The heat generating component 4 was mounted on the circuit board 3 by soldering using a ball grid array (BGA) type ASIC in which the bonding materials 46 formed as a total of 224 solder balls at a pitch of 0.8 mm are arranged in an array. An area of the heat generating component 4 is 23 mm×23 mm. A material of the bonding material 46 is Sn-3.0Ag-0.5Cu (unit: wt %).

The circuit board 3 was formed of a 200 mm×140 mm×1.6 mm (thickness) FR4 material. Equivalent thermal conductivity of the circuit board 3 is 69 W/mK in an in-plane direction and 0.45 W/mK in a vertical direction.

The case body 1 was formed using ADC 12 having thermal conductivity of 96 W/mK.

The cover 2 was formed using a sheet metal having thermal conductivity of 65 W/mK.

The connector 11 formed by press-fitting the connector pin 12 made of a copper alloy having thermal conductivity of 121 W/mK into the connector body 13 made of polybutylene terephthalate (PBT) containing 30% glass fiber was used.

As the heat conductive sheet 6 of the heat conductive member 5, a graphite sheet laminate having thermal conductivity of 1500 W/mK was used. As shown in FIGS. 5 and 6(c), the graphite sheet laminate has the folded structure in which the sliding layers 7a and 7b are provided between the pair of connection portions 63 adjacent to the one folded-back portion 62a. The thickness t of this graphite sheet laminate is 25 μm, and the height h of the folded portion is 1 mm.

Further, as Comparative Example 1, an electronic control device obtained by thermally coupling a flat heat conductive sheet made of a mixture of a silicone-based resin and a heat conductive filler to the step portion 15 of the case body 1 and the heat generating component 4 in a flat sheet shape was produced. Thermal conductivity of the heat conductive member made of the silicone-based resin is 2 W/mK. A thickness of the heat conductive sheet of Comparative Example 1 was 1 mm, and a planar area (an area covering the heat generating component 4) is the same as that of the heat conductive sheet 6 of Example 1. Further, an appearance and a cross-sectional structure of the electronic control device of this comparative example are the same as those of Example 1.

Figure 7:
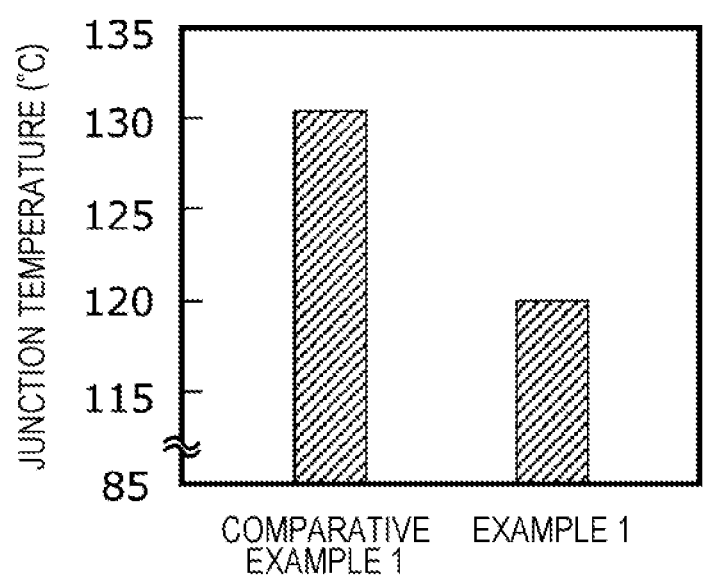
FIG. 7 is a graph for showing a heat radiation effect according to the embodiment of the present invention.

FIG. 7 is a graph showing a heat radiation effect according to the embodiment of the present invention.

FIG. 7 shows junction temperature of the heat generating component 4 of each of the electronic control device 100 according to Example 1 and the electronic control device according to Comparative Example 1. The junction temperature shown in FIG. 7 is in a windless environment at an environmental temperature of 85° C., and power consumption of the heat generating component 4 is 5 W.

As shown in FIG. 7, the junction temperature of the heat generating component 4 of Example 1 was lower than the junction temperature of the heat generating component 4 of Comparative Example 1.

Note that the junction temperature is temperature at a substantially central portion JT on one side surface on an outer peripheral side of the semiconductor chip 41 constituting the heat generating component 4 shown in FIG. 4.

According to the above-described first embodiment, the following effects can be obtained.

(1) The electronic control device 100 includes the heat conductive sheet 6 thermally coupled to one surface of the heat generating component 4 located on a side opposite to the circuit board 3 side and the cooling mechanism (the case body 1) thermally coupled to the heat conductive sheet 6. The heat conductive sheet 6 has the folded structure having the plurality of folded-back portions 62a, 62b and the plurality of connection portions 63 provided between the folded-back portions 62a and 62b, and the plurality of folded-back portions 62a and 62b of the heat conductive sheet 6 is thermally coupled to the heat generating component 4 and the cooling mechanism, respectively. Therefore, even if the circuit board 3 or the like is thermally deformed or vibrates, the heat conductive sheet 6 deforms following the thermal deformation or vibration, so that a load applied to the heat generating component 4 can be reduced. As a result, damage to the heat generating component 4 and deterioration of characteristics can be prevented, and reliability can be improved.

(2) The adhesive layer is provided at least either between the heat generating component 4 and the heat conductive sheet 6 or between the heat conductive sheet 6 and the cooling mechanism (the case body 1). Therefore, the spread of the heat conductive sheet 6 between the folded-back portions 62a and 62b is suppressed, and a process of attaching the heat conductive sheet 6 to the cooling mechanism or the heat generating component 4 can be efficiently performed.

(3) The sliding layers 7a and 7b are provided between the connection portions 63, and the facing surfaces of the sliding layers 7a and 7b facing each other are non-adhesive surfaces. Therefore, the heat conductive member 5 can slide and deform on the facing surfaces of the sliding layers 7a and 7b, and can more easily follow thermal deformation and vibration of the circuit board 3 and the like.

(4) The facing surfaces of the adjacent connection portions 63 are relatively movable sliding surfaces. Therefore, the heat conductive sheet 6 can slide and deform on the facing surfaces of the adjacent connection portions 63, and can easily follow thermal deformation and vibration of the circuit board 3 and the like.

(5) The heat conductive sheet 6 is made of a graphite sheet or a laminate of the graphite sheets, and a crystal in-plane direction of graphite is oriented to an extending direction of the connection portion 63 in the graphite sheet or the laminate of the graphite sheets. Therefore, thermal conductivity of the connection portion 63, that is, thermal conductivity of the heat conductive sheet 6 can be enhanced, and a heat radiation effect of the heat generating component 4 can be increased.

Second Embodiment

Figure 8:
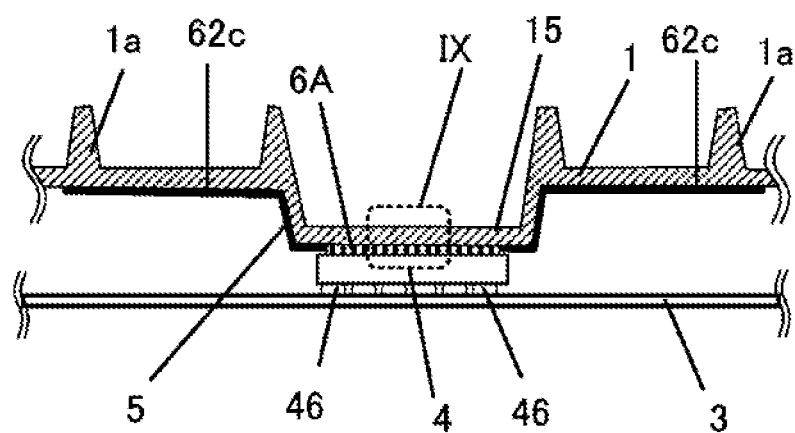
FIG. 8 is a sectional view showing a heat radiation structure according to a second embodiment of the present invention.

FIG. 8 is a sectional view showing a heat radiation structure according to a second embodiment of the present invention.

An electronic control device 100 according to the second embodiment has a heat radiation structure in which a heat conductive sheet 6A constituting a heat conductive member 5 is extended in a folding direction at both ends in the folding direction and is thermally coupled to an inner surface of a case body 1.

As shown in FIG. 8, the heat conductive sheet 6A has flat portions 62c extended from one end and another end in the folding direction outward from a folded portion. Each of the flat portions 62c is adhered to the inner surface of the case body 1 by an adhesive (not shown) or the like.

Other configurations of the second embodiment are the same as those of the first embodiment, and corresponding components are denoted by the same reference numerals and description thereof will be omitted.

The second embodiment also has the heat radiation structure similar to that of the first embodiment. Therefore, the second embodiment has the same effect as the first embodiment. Further, in the second embodiment, the heat conductive sheet 6A is larger than the heat conductive sheet 6 of the first embodiment by areas of the flat portions 62c, and the flat portions 62c are thermally coupled to the inner surface of the case body 1. Therefore, according to the second embodiment, a greater heat radiation effect can be obtained.

Note that, in the second embodiment, the heat conductive sheet 6A is exemplified as a structure in which the flat portions 62c are provided at both ends of the folded portion. However, the flat portion 62c may be provided only at one end of the folded portion.

Third Embodiment

Figure 9:
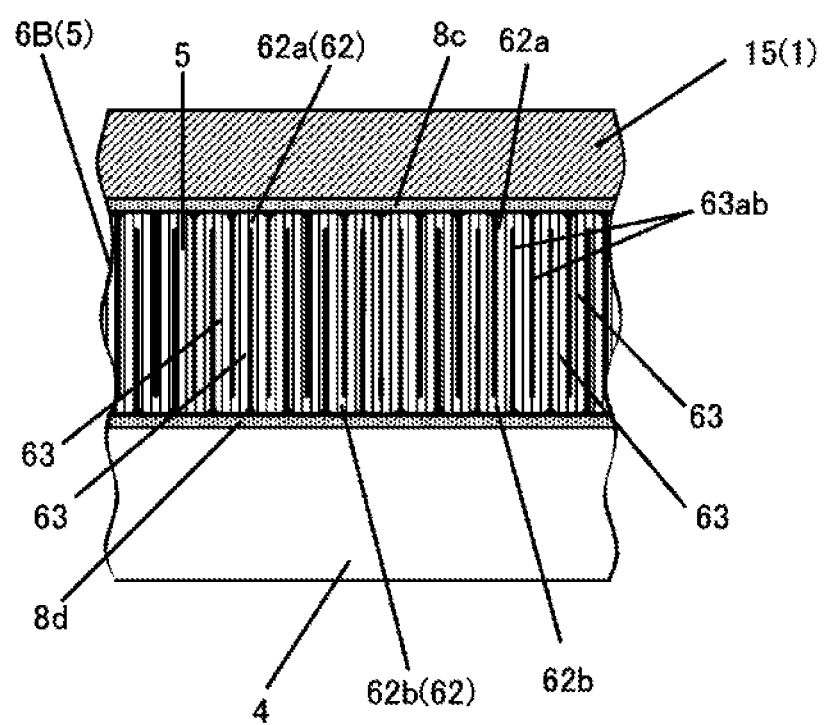
FIG. 9 is a sectional view showing a heat radiation structure according to a third embodiment of the present invention.

FIG. 9 is a sectional view showing a heat radiation structure according to a third embodiment of the present invention.

An electronic control device 100 according to the third embodiment includes a heat conductive member 5 constituted only by a heat conductive sheet 6B. In other words, the heat conductive member 5 does not have the sliding layers 7a and 7b of the heat conductive member 5 in the first embodiment.

As shown in FIG. 9, the heat conductive sheet 6B is configured such that one folded-back portion 62a provided on a case body 1 side and another folded-back portion 62b provided on a heat generating component 4 side are formed continuously via a connection portion 63. The sliding layers 7a and 7b are not interposed even between the pair of connection portions 63 arranged with the folded-back portion 62a interposed therebetween or even between the pair of connection portions arranged with the folded-back portion 62b interposed therebetween. Further, the heat conductive sheet 6B does not have adhesive layers 8a and 8b on one surface and another surface. Therefore, in the heat conductive sheet 6B, facing surfaces 63ab of all the adjacent connection portions 63 are slidable and deformable sliding surfaces.

An adhesive layer 8c is interposed between the one folded-back portion 62a of the heat conductive sheet 6B and a step portion 15 of the case body 1, and the heat conductive sheet 6B and the case body 1 are thermally coupled via the adhesive layer 8c. An adhesive layer 8d is interposed between the other folded-back portion 62b of the heat conductive sheet 6B and the heat generating component 4, and the heat conductive sheet 6B and the heat generating component 4 are thermally coupled via the adhesive layer 8d.

The heat conductive sheet 6B can be constituted by a graphite sheet or a laminate of the graphite sheets. Further, in the graphite sheet laminate, at the connection portion 63 connecting the folded-back portions 62a and 62b, a crystal in-plane direction of graphite is oriented to an extending direction of the connection portion 63. Therefore, thermal conductivity of the connection portion 63, that is, thermal conductivity of the heat conductive sheet 6 can be enhanced, and a heat radiation effect of the heat generating component 4 can be increased.

Other configurations of the third embodiment are the same as those of the first embodiment, and corresponding components are denoted by the same reference numerals and description thereof will be omitted.

In the third embodiment, the heat conductive sheet 6B slides and deforms on the facing surfaces 63ab of all the adjacent connection portions 63, and thus has the same operation as that of the first embodiment. Therefore, the third embodiment also has the effects (1), (2), (4), and (5) of the first embodiment. In the third embodiment, cost can be reduced and productivity can be improved because the heat conductive member 5 does not have the sliding layers 7a and 7b.

Note that, in the third embodiment, a flat portion 62c extending in a folding direction may be provided at one or both ends of a folded portion of the heat conductive sheet 6B, as in the second embodiment.

(Modification of Heat Generating Component)

Figure 10A:
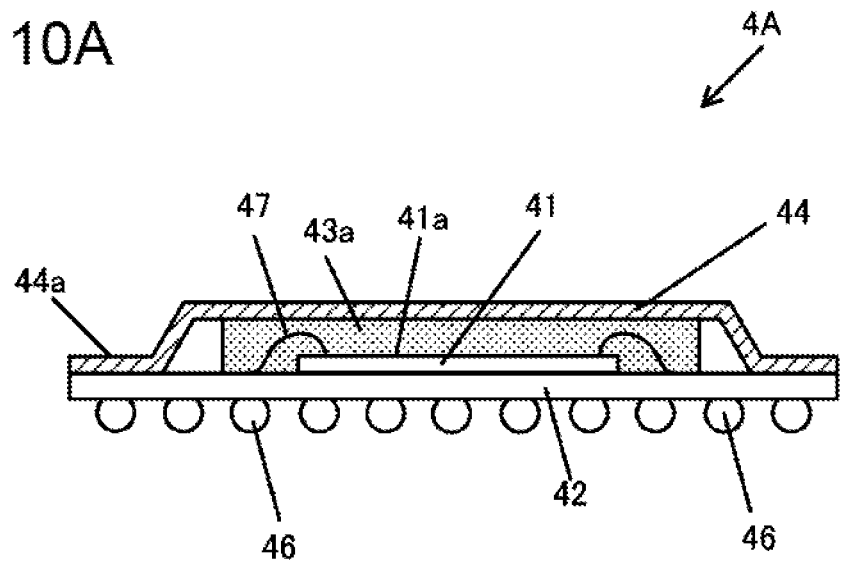
FIGS. 10A and 10B are sectional views each showing another example of the heat generating component shown in FIG. 4.

FIGS. 10(a) and (b) are sectional views each showing another example of the heat generating component 4 shown in FIG. 4.

A heat generating component 4A shown in FIG. 10(a) is also a BGA type semiconductor device. The heat generating component 4A has a structure in which a semiconductor chip 41 is mounted face-up on an interposer 42.

In other words, in a state in which a main surface 41a on which an integrated circuit is formed faces an opposite side of the interposer 42, the semiconductor chip 41 has an opposite surface of the main surface die-bonded on a board and is connected to the interposer 42 by bonding wires 47. A heat radiation material 43a is formed between the semiconductor chip 41 and a lid 44. Other structures of the heat generating component 4A are the same as those of the heat generating component 4, and corresponding members are denoted by the same reference numerals and description thereof is omitted. Such a heat generating component 4A can also be replaced with the heat generating component 4 shown in the first to third embodiments.

Figure 10B:
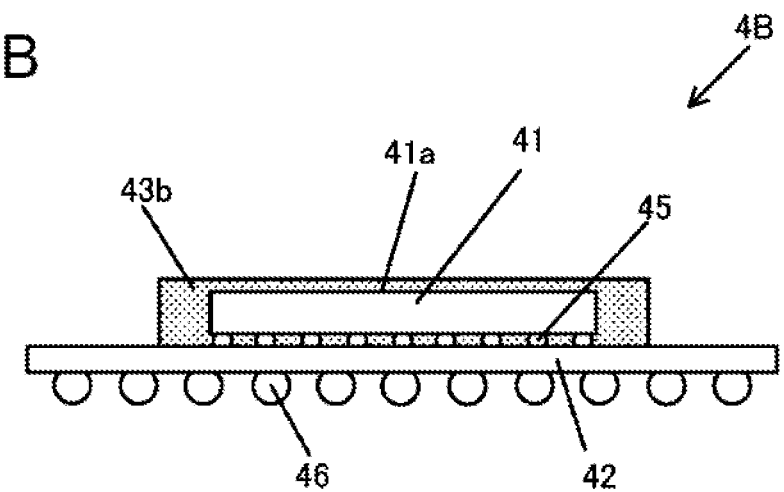

A heat generating component 4B illustrated in FIG. 10(b) is a BGA type semiconductor device that does not have a metal lid 44. A semiconductor chip 41 of the heat generating component 4B is flip-chip mounted on an interposer 42 by bonding materials 45 such as solder. The entire semiconductor chip 41 mounted on the interposer 42 is sealed with a sealing resin 43b. Such a heat generating component 4B can also be replaced with the heat generating component 4 shown in the first to third embodiments.

Note that, in the above-described embodiments, the cooling mechanism is exemplified as a structure in which the case body 1 is provided with the heat radiation fins 1a. However, a cooling mechanism that simply cools with a cooling liquid without providing the heat radiation fins 1a can be used.

In each of the above embodiments, the heat conductive sheet 6, 6A, or 6B constituting the heat conductive member 5 is exemplified as the graphite sheet laminate. However, a sheet member in which a heat conductive filler is mixed in a resin such as silicone may be used as the heat conductive sheet 6, 6A, or 6B. In short, it is sufficient if the heat conductive member 5 includes the heat conductive sheet 6, 6A, or 6B having the folded structure.

In the above embodiments, the structure in which the folded-back portions 62a and 62b of the heat conductive sheet 6, 6A, or 6B are adhered between the heat generating component and the heat conductive sheet 6 and between the heat conductive sheet 6 and the cooler case body 1 by the adhesive layers 62a and 62b is exemplified. However, only one of the folded-back portions 62a and 62b of the heat conductive sheets 6, 6A, or 6B may be bonded to the case body 1 or the heat generating component 4.

In each of the above embodiments, the heat generating components 4, 4A, and 4B are exemplified as BGA type semiconductor devices. However, the present invention can also be applied to a heat radiation structure of a semiconductor device other than the BGA type.

In the above embodiments, the structure in which the step portion 15 is provided on the surface of the cooling mechanism on the heat generating component 4 side is exemplified. However, the step portion 15 is not always necessary.

Although various embodiments and modifications have been described above, the present invention is not limited to these contents. Other embodiments that can be considered within the scope of the technical idea of the present invention are also included in the scope of the present invention.

The disclosure of the following priority application is incorporated herein by reference.

Japanese Patent Application No. 2018-058156 (filed on Mar. 26, 2018)

REFERENCE SIGNS LIST 1 case body (cooling mechanism)
3 circuit board (board)
4, 4A, 4B heat generating component
5 heat conductive member
6, 6A, 6B heat conductive sheet
7, 7a, 7b sliding layer
7ab facing surface
8a, 8b, 8c, 8d adhesive layer
61 graphite sheet
62 folded-back portion
62a one folded-back portion
62b another folded-back portion
62c flat portion
63 connection portion
63ab facing surface
100 electronic control device

The invention claimed is:

1. An electronic control device comprising:
a board;
a heat generating component mounted on the board;
a heat conductive sheet thermally coupled to one surface of the heat generating component located on the one surface facing away from the board; and
a cooling mechanism thermally coupled to the heat conductive sheet,
wherein the heat conductive sheet includes a folded structure having a plurality of folded-back portions and a plurality of adhesively bonded connection portions provided between the folded-back portions, and
the plurality of folded-back portions of the heat conductive sheet is thermally coupled to each of the heat generating component and the cooling mechanism.

2. The electronic control device according to claim 1, wherein an adhesive layer is provided at least either between the heat generating component and the heat conductive sheet or between the heat conductive sheet and the cooling mechanism.

3. The electronic control device according to claim 1, wherein a sliding layer is provided between the connection portions, and facing surfaces of the sliding layers facing each other are non-adhesive surfaces.

4. The electronic control device according to claim 1, wherein facing surfaces of adjacent connection portions are movable sliding surfaces.

5. The electronic control device according to claim 1, wherein the heat conductive sheet has a flat portion connected to the folded-back portion on at least one of one end side and another end side in an arrangement direction of the plurality of folded-back portions, and the flat portion is thermally coupled to the cooling mechanism.

6. The electronic control device according to claim 1, wherein the heat conductive sheet is formed of a graphite sheet or a graphite sheet laminate.

7. The electronic control device according to claim 6, wherein the graphite sheet or the graphite sheet laminate has a crystal in-plane direction of graphite oriented to an extending direction of the connection portions.

* * * * *